US011221531B2

(12) United States Patent
Cheng

(10) Patent No.: US 11,221,531 B2
(45) Date of Patent: Jan. 11, 2022

(54) DISPLAY SUBSTRATE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Hongfei Cheng, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/758,024

(22) PCT Filed: Oct. 29, 2019

(86) PCT No.: PCT/CN2019/113985
§ 371 (c)(1),
(2) Date: Apr. 21, 2020

(87) PCT Pub. No.: WO2020/088445
PCT Pub. Date: May 7, 2020

(65) Prior Publication Data
US 2021/0208461 A1 Jul. 8, 2021

(30) Foreign Application Priority Data

Oct. 29, 2018 (CN) .......................... 201821757572.4

(51) Int. Cl.
G02F 1/1362 (2006.01)

(52) U.S. Cl.
CPC .. *G02F 1/136286* (2013.01); *G02F 1/136204* (2013.01)

(58) Field of Classification Search
None
See application file for complete search history.

(56) References Cited

U.S. PATENT DOCUMENTS

2003/0030054 A1* 2/2003 Hector .............. G02F 1/136204
257/72
2006/0103788 A1 5/2006 Kurosawa et al.
(Continued)

FOREIGN PATENT DOCUMENTS

CN 1790653 A 6/2006
CN 103941908 A 7/2014
(Continued)

OTHER PUBLICATIONS

ISA China National Intellectual Property Administration, International Search Report Issued in Application No. PCT/CN2019/113985, WIPO, 18 pages. (Submitted with Partial Translation).

*Primary Examiner* — Thanh Nhan P Nguyen
(74) *Attorney, Agent, or Firm* — McCoy Russell LLP

(57) ABSTRACT

The preset disclosure discloses a display substrate and a display device. The display substrate includes a signal line. The display substrate further includes: a discharge-limiting component, and an orthographic projection of the discharge-limiting component on the base substrate of the display substrate and an orthographic projection of the signal line on the base substrate at least partially overlap.

16 Claims, 7 Drawing Sheets

(56) References Cited

U.S. PATENT DOCUMENTS

2015/0177859 A1 6/2015 Zhou et al.
2018/0108649 A1 4/2018 Cheng

FOREIGN PATENT DOCUMENTS

| CN | 203733797 U | 7/2014 |
| CN | 106200172 A | 12/2016 |
| CN | 206301112 U | 7/2017 |
| CN | 208795966 U | 4/2019 |
| JP | 2001339051 A | 12/2001 |

* cited by examiner

DISPLAY SUBSTRATE AND DISPLAY DEVICE

CROSS-REFERENCE TO RELATED APPLICATIONS

The present application is a U.S. National Phase of International Patent Application Serial No. PCT/CN2019/113985 entitled "DISPLAY SUBSTRATE AND DISPLAY DEVICE" filed on Oct. 29, 2019. International Patent Application Serial No. PCT/CN2019/113985 claims the priority of Chinese Patent Application No. 201821757572.4 filed on Oct. 29, 2018. The entire contents of each of the above-referenced applications are hereby incorporated by reference for all purposes.

TECHNICAL FIELD

The present disclosure relates to the field of display technology, and in particular to a display substrate and a display device.

BACKGROUND

With the continuous development of display technology, people have put forward higher and higher requirements for the operation stability of display devices. As one of the important factors affecting the operation stability of display devices, static electricity has received widespread attention. The display substrates currently used in display devices generally include electronics and multiple signal lines. However, the display substrate is prone to generate static electricity during manufacturing and operating, and the static electricity is likely to damage the electronic devices and signal lines, which reduces the yield of the display substrate.

SUMMARY

A first aspect of the present disclosure provides a display substrate which includes: a base substrate; a signal line provided on the base substrate; a first discharge-limiting component provided on the base substrate; wherein an orthographic projection of the first discharge-limiting component on the base substrate of the display substrate and an orthographic projection of the signal line on the base substrate at least partially overlap.

Optionally, the orthographic projection of the first discharge-limiting component on the base substrate and an orthographic projection of an end portion of the signal line on the base substrate at least partially overlap.

Optionally, the display substrate further includes a passivation layer covering the signal line; the first discharge-limiting component is directly formed on a surface of the passivation layer away from the signal line, and the orthographic projection of the first discharge-limiting component on the base substrate covers the orthographic projection of the end portion of the signal line on the base substrate.

Optionally, the first discharge-limiting component has an elongated shape along an extending direction of the signal line, and has a portion extending beyond the end portion of the signal line.

Optionally, along the extending direction of the signal line, a length of the portion of the first discharge-limiting component extending beyond the end portion of the signal line is greater than or equal to about 0.5 µm and less than or equal to 10 µm.

Optionally, the signal line has a polyline shape and includes at least one bending portion, the orthographic projection of the first discharge-limiting component on the base substrate and an orthographic projection of the bending portion of the signal line on the base substrate at least partially overlap.

Optionally, the display substrate further includes a second discharge-limiting component provided on the base substrate, a lead for signal line provided on the base substrate, and a connection via for connecting the signal line to the lead for signal line; an orthographic projection of the second discharge-limiting component on the base substrate and an orthographic projection of the connection via on the base substrate at least partially overlap.

Optionally, the orthographic projection of the second discharge-limiting component on the base substrate covers the orthographic projection of the connection via on the base substrate.

Optionally, the display substrate further includes a passivation layer covering the signal line and the connection via; the second discharge-limiting component is directly formed on a surface of the passivation layer away from the signal line.

Optionally, the display substrate further includes: a first electrostatic protection line provided on the base substrate; a first electrostatic protection unit connected to the signal line and the first electrostatic protection line respectively; and a third discharge-limiting component provided on the base substrate; wherein, an orthographic projection of the third discharge-limiting component on the base substrate and an orthographic projection of the first electrostatic protection unit on the base substrate at least partially overlap.

Optionally, the first electrostatic protection line is connected to a common electrode line.

Optionally, the display substrate further includes: a fourth discharge-limiting component provided on the base substrate; and a second electrostatic protection unit connected to the first electrostatic protection line and the common electrode line respectively; wherein, an orthographic projection of the fourth discharge-limiting component on the base substrate and an orthographic projection of the second electrostatic protection unit on the base substrate at least partially overlap.

Optionally, the first, second, third, and fourth discharge-limiting components each include a resin member.

Optionally, the first, second, third, and fourth discharge-limiting components each have a thickness of about 1 µm to about 3 µm in a direction perpendicular to the base substrate.

Optionally, the signal line includes a gate line and/or a data line.

A second aspect of the present disclosure provides a display substrate which includes: a base substrate; a signal line provided on the base substrate; a first electrostatic protection line provided on the base substrate; a first electrostatic protection unit connected to the signal line and the first electrostatic protection line respectively; and a discharge-limiting component; wherein, an orthographic projection of the discharge-limiting component on the base substrate and an orthographic projection of the first electrostatic protection unit on the base substrate at least partially overlap.

Optionally, the orthographic projection of the discharge-limiting component on the base substrate covers the orthographic projection of the first electrostatic protection unit on the base substrate.

Optionally, the first electrostatic protection line is connected to a common electrode line.

Optionally, the display substrate further includes:
a second electrostatic protection unit connected to the first electrostatic protection line and the common electrode line respectively; and another discharge-limiting component;
wherein, an orthographic projection of the another discharge-limiting component on the base substrate and an orthographic projection of the second electrostatic protection unit on the base substrate at least partially overlap.

Optionally, the discharge-limiting component and the another discharge-limiting component each includes a resin member.

Optionally, the discharge-limiting component and the another discharge-limiting component each have a thickness of 1 µm to 3 µm in a direction perpendicular to the base substrate.

Optionally, the signal line includes a gate line and/or a data line.

A third aspect of the present disclosure provides a display substrate which includes: a base substrate; a signal line provided on the base substrate; a first electrostatic protection line provided on the base substrate; a common electrode line provided on the base substrate; a first electrostatic protection unit connected to the signal line and the first electrostatic protection line respectively; a second electrostatic protection unit connected to the first electrostatic protection line and the common electrode line respectively; and a discharge-limiting component provided on the base substrate; wherein an orthographic projection of the discharge-limiting component on the base substrate and an orthographic projection of the second electrostatic protection unit on the base substrate at least partially overlap.

Optionally, the orthographic projection of the discharge-limiting component on the base substrate covers the orthographic projection of the second electrostatic protection unit on the base substrate.

Optionally, the discharge-limiting component includes a resin member.

Based on the technical solutions of the above display substrates, a fourth aspect of the present disclosure provides a display device which includes any of the above display substrate, an opposite substrate, and a photo spacer provided on the display substrate; wherein the discharge-limiting component in the display substrate is manufactured in a same layer and with a same material as the photo spacer.

BRIEF DESCRIPTION OF THE DRAWINGS

The drawings described here as a part of the present disclosure are to provide a further understanding of the present disclosure. The exemplary embodiments of the present disclosure and the description thereof are intended to explain the present disclosure, but not meant to limit the scope of the present disclosure. In the drawings.

DETAILED DESCRIPTION

In order to further explain the display substrate and the display device provided by the embodiments of the present disclosure, the detailed description is made below with reference to the accompanying drawings.

Figure 1:
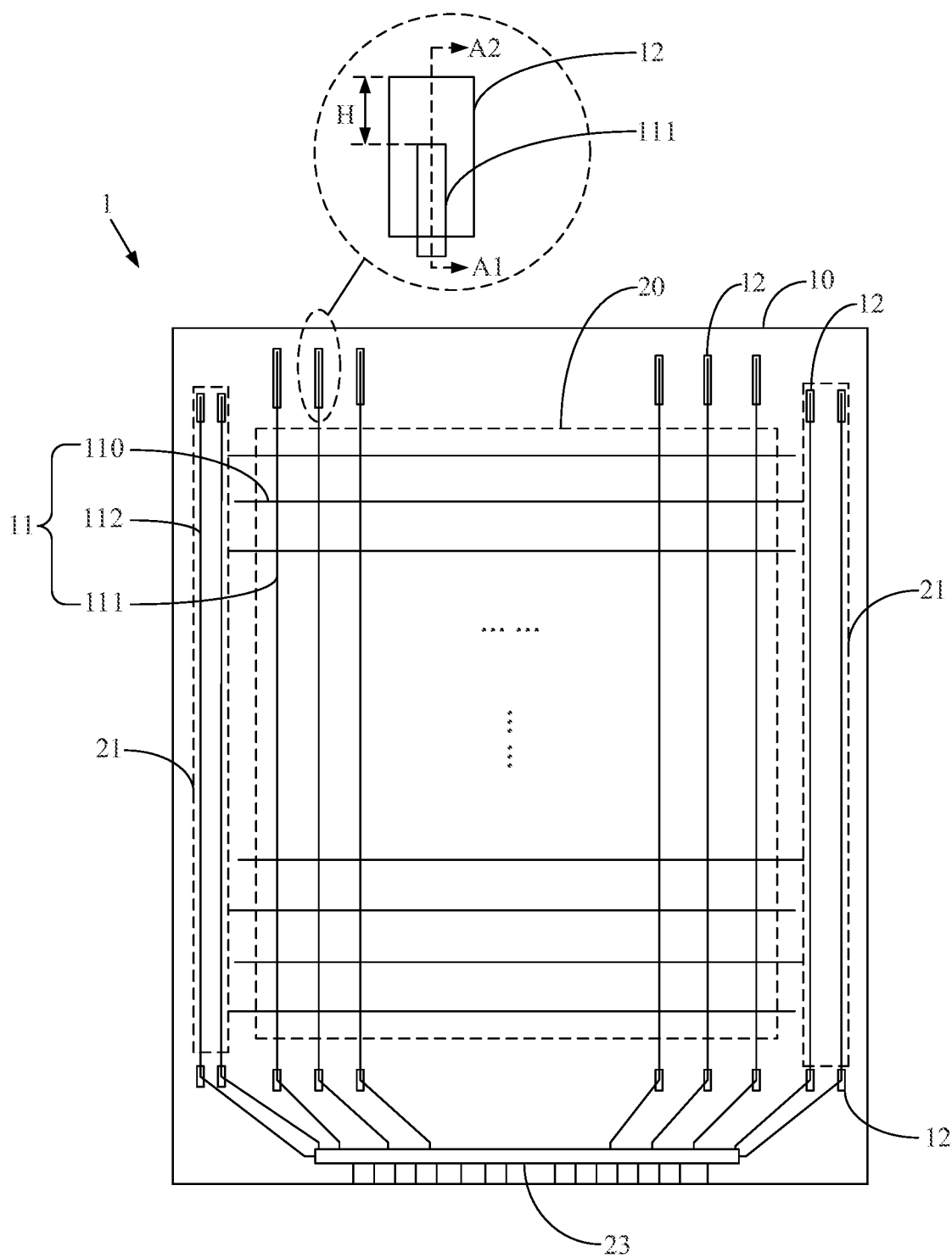
FIG. 1 is a first structural diagram of a display substrate according to an embodiment of the present disclosure.
Figure 2:
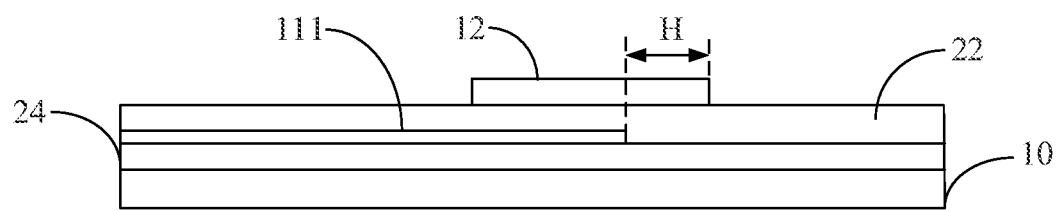
FIG. 2 is a cross-sectional view along the direction A1-A2 in FIG. 1.

As shown in FIGS. 1 and 2, an embodiment of the present disclosure provides a display substrate 1 including signal lines 11. The display substrate 1 further includes a discharge-limiting component 12. An orthographic projection of the discharge-limiting component 12 on a base substrate 10 of the display substrate 1 and orthographic projections of the signal lines 11 on the base substrate 10 at least partially overlap.

In a practical application of the above display substrate 1, electric signal is transmitted on the signal line 11, so that it is easy to accumulate electrostatic charges on the signal line 11. With the arrangement in which the orthographic projection of the discharge-limiting component 12 on the base substrate 10 of the display substrate 1 and the orthographic projection of the signal line 11 on the base substrate 10 at least partially overlap, a portion of the signal line 11 located within the overlapping region is insulated from the surrounding film layer having conductivity, thereby limiting the signal line 11 from discharging in this overlapping region.

It should be noted that the above display substrate 1 may be used as an array substrate in a liquid crystal display device, or may also be applied to an organic light emitting diode display device, but it is not limited thereto.

According to the specific structure and the practical application of the above display substrate 1, it can be known that, in the display substrate 1 provided in the embodiment of the present disclosure, a discharge-limiting component 12 is provided, and the orthographic projection of the discharge-limiting component 12 on the base substrate 10 of the display substrate 1 at least partially overlaps with the orthographic projection of the signal line 11 on the base substrate 10; the abnormal discharge of the signal line 11 located in the overlapping region is limited by the discharge-limiting component 12, thereby avoiding the damage of the signal line 11 caused by the abnormal discharge of the signal line 11 and preventing the abnormal discharge of the signal line 11 from affecting the electronics included in the display substrate 1. Therefore, the display substrate 1 provided by the embodiment of the present disclosure is prevented from abnormal electrostatic discharge and has a high yield.

The overlapping region of the above discharge-limiting component 12 and the signal line 11 may be arranged according to actual needs. The following lists several specific overlapping modes of the discharge-limiting component 12 and the signal line 11 and analyzes their beneficial effects.

In some embodiments, the orthographic projection of the discharge-limiting component 12 on the base substrate 10 may be arranged to at least partially overlap with an orthographic projection of an end portion of the signal line 11 on the base substrate 10.

Specifically, with the arrangement in which the orthographic projection of the discharge-limiting component 12 on the base substrate 10 and the orthographic projection of the end portion of the signal line 11 on the base substrate 10 at least partially overlap, the end portion of the signal line 11 can be insulated from the surrounding film layer having conductivity by the discharge-limiting component 12, preventing the signal line 11 from discharging to the outside through its end and thus preventing an influence on the yield of the display substrate 1. In some embodiments, along an extending direction of the signal line 11, the discharge-limiting component 12 has an elongated shape, and has a portion extending beyond the end portion of the signal line.

Specifically, the discharge-limiting component 12 with the above structure not only enables the discharge-limiting component 12 to better insulate the entire end portion of the signal line 11 from the surrounding film layer having conductivity so that the signal line 11 is prevented from discharging to the outside through its end, but also enables the discharge-limiting component 12 itself to occupy a relatively small area so that it does not have much influence on the wiring of the display substrate 1.

Further, along the extending direction of the signal line 11, a length of the portion of the discharge-limiting component 12 extending beyond the end portion of the signal line 11 is greater than or equal to about 0.5 μm (e.g., the error is 5% or less) and less than or equal to 10 μm (e.g., the error is 5% or less).

Specifically, the portion of the discharge-limiting component 12 extending beyond the end portion of the signal line 11 that is arranged to have the above length (H as shown in FIGS. 1 and 2) not only enables the discharge-limiting component 12 to better insulate the entire end portion of the signal line 11 from the surrounding film layer having conductivity so that the signal line 11 is prevented from discharging through its end to the outside, but also enables the discharge-limiting component 12 itself to occupy a relatively small area so that it does not have much influence on the wiring of the display substrate 1.

In some other embodiments, the signal line 11 has a polyline shape and includes at least one bending portion, the orthographic projection of the discharge-limiting component 12 on the base substrate and an orthographic projection of the bending portion of the signal line 11 on the base substrate at least partially overlap.

Specifically, in the case that the signal line 11 has a polyline shape, the signal line 11 not only easily discharges from the end portion of the signal line 11, but also easily discharges from the bending portion of the signal line 11. With the arrangement in which the orthographic projection of the discharge-limiting component 12 on the base substrate and the orthographic projection of the bending portion of the signal line 11 on the base substrate at least partially overlap, the bending portion of the signal line 11 can be insulated from the surrounding film layer having conductivity by the discharge-limiting component 12, thereby preventing the signal line 11 from discharging to the outside through the bending portion and thus preventing an influence on the yield of the display substrate 1.

Figure 3:
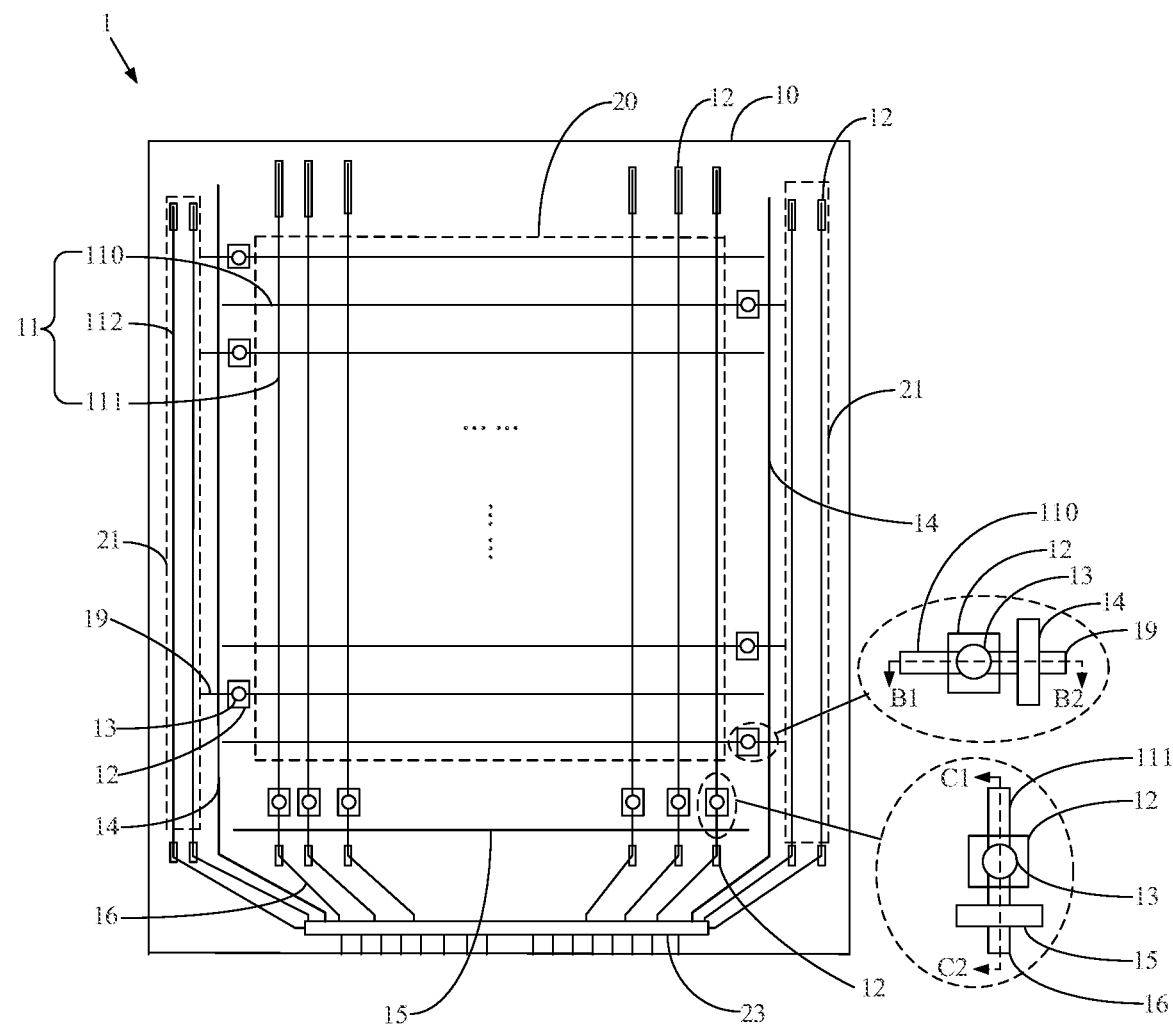
FIG. 3 is a second structural diagram of a display substrate according to an embodiment of the present disclosure.
Figure 4:
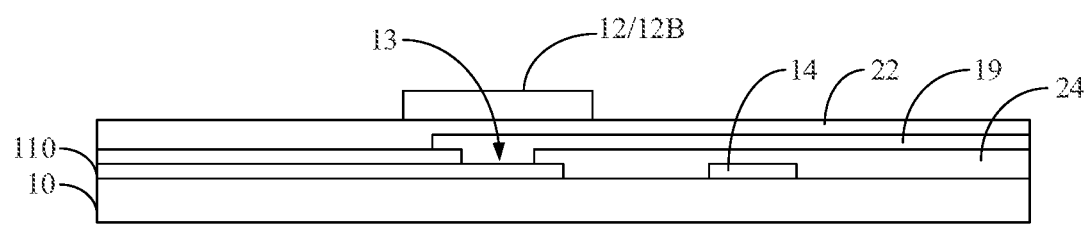
FIG. 4 is a cross-sectional view along the direction B1-B2 in FIG. 3.
Figure 5:
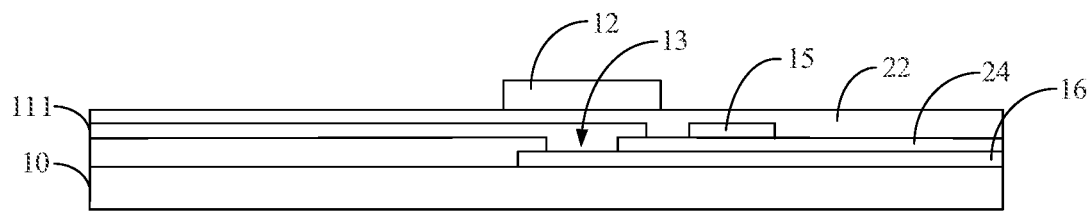
FIG. 5 is a cross-sectional view along the direction C1-C2 in FIG. 3.

In some other embodiments, as shown in FIGS. 3 to 5, the display substrate 1 further includes connection vias 13 for connecting the signal lines 11 to leads for signal lines in the display substrate 1, and the orthographic projection of the discharge-limiting component 12 on the base substrate 10 and orthographic projections of the connection vias 13 on the base substrate 10 at least partially overlap.

Specifically, due to the limitation of the wiring area, the display substrate 1 generally arranges the signal lines 11 and leads for signal lines connected thereto in different layers, and realizes the connection between the two by providing a connection via 13 therebetween. See FIG. 3 for the gate line 110, the lead 19 for gate line, the data line 111, and the lead 16 for data line. With the arrangement in which the orthographic projection of the discharge-limiting component 12 on the base substrate 10 and the orthographic projection of the connection via 13 on the base substrate 10 at least partially overlap, the connection via 13 can be insulated from the surrounding film layer having conductivity by the discharge-limiting component 12, thereby preventing a discharge from occurring at the connection via 13 and thus preventing a damage of the connection via 13 and an influence on the yield of the display substrate 1.

It should be noted that, the above connection via 13 is not limited to connecting the signal line 11 and the lead for signal line, but may also be used to connect two signal lines 11 with different functions, or to connect a signal line 11 and an electrodes in the display substrate 1.

In some other embodiments, the display substrate 1 further includes a connection via 13 for connecting the signal line 11 to the lead for signal line in the display substrate 1, and the orthographic projection of the discharge-limiting component 12 on the base substrate 10 covers the orthographic projection of the connection via 13 on the base substrate 10.

Specifically, with the arrangement in which the orthographic projection of the discharge-limiting component 12 on the base substrate 10 covers the orthographic projection of the connection via 13 on the base substrate 10, the entire connection via can be insulated from the surrounding film layer having conductivity by the discharge-limiting component 12, thereby preventing a discharge from occurring at the connection via 13 and thus preventing an influence on the yield of the display substrate 1.

Further, the above discharge-limiting component 12 may be made of various materials, provided that the material has good insulativity. As an example, the discharge-limiting component 12 may be manufactured in a same layer and with a same material as the photo spacers in the display substrate 1.

Specifically, a liquid crystal display device mainly includes an array substrate and a color filter substrate arranged opposite to each other, with liquid crystal molecules filled therebetween. Further, photo spacers are provided between the array substrate and the color filter substrate. The photo spacers may be disposed on either the array substrate or the color filter substrate to control the cell thickness of the liquid crystal cell formed by aligning the array substrate and the color film substrate. When the display substrate 1 is applied to a liquid crystal display device, the display substrate 1 may be used as an array substrate, and the photo spacers may be disposed on the display substrate 1. Since the material of the photo spacers is generally an insulation material, manufacturing the discharge-limiting component in the same layer and with the same material as the photo spacers not only makes the resulted discharge-limiting component 12 have good insulativity in order to better limit the discharge, but also realizes the simultaneous manufacture of the photo spacers and the discharge-limiting component 12 by a single patterning process, which avoids adding a manufacturing process dedicated to the discharge-limiting component 12, thereby effectively simplifying the manufacturing process flow of the display substrate 1 and saving manufacturing costs.

In some embodiments, the discharge-limiting component 12 may include a resin member.

Specifically, because the resin material itself has good light transmittance and insulativity, the discharge-limiting component 12 that is manufactured as a resin member using the resin material ensures that the discharge-limiting component 12 has both good insulativity and good light transmittance. In this way, when the discharge-limiting component 12 is disposed in the display substrate 1, the size of the discharge-limiting component 12 can be made as large as possible to enhance its discharge-limiting effect. It can be seen that the discharge-limiting component 12 that is a resin member can make the discharge-limiting component 12 have a better discharge-limiting effect without affecting the transmittance of the display substrate 1.

The size of the above discharge-limiting component 12 may be set according to actual needs. Exemplarily, the thickness of the discharge-limiting component 12 in a direction perpendicular to the base substrate 10 may be set to about 1 μm to 3 μm (for example, the error is 5% or less). The discharge-limiting component 12 set in such a size can realize a good discharge-limiting effect without having a significant influence on the overall thickness of the display substrate 1, which is advantageous for reducing the thickness of the display substrate 1.

In the display substrate 1 provided in the above embodiment, there are various types of signal lines. For example, the signal lines 11 includes gate lines 110, data lines 111, and/or GOA traces 112 located in the gate driver circuit region 21 in the periphery of the display region 20, and so on. It should be noted that Gate Driver on Array (GOA) technology refers to a technology in which the gate driver circuit is directly manufactured on the array substrate. In this technology, a gate driver circuit region is formed by manufacturing the gate driver circuit in a peripheral region located in the periphery of the display region of the array substrate. The gate driver circuit thus manufactured includes electronic components and signal wiring for providing signals to the electronic components (e.g. GOA traces 112).

The display substrate 1 provided in the above embodiment further includes a driver chip 23, gate electrodes, a gate insulation layer 24, an active layer, source electrodes, drain electrodes, a passivation layer 22, pixel electrodes, and so on; the gate insulation layer 24 may adopt a single-layer structure made of silicon nitride or silicon oxide, or a multilayer structure made of silicon nitride and silicon oxide; the pixel electrodes may be made of indium tin oxide, and the passivation layer 22 may adopt a single-layer structure made of silicon nitride or silicon oxide, or a multilayer structure made of silicon nitride and silicon oxide.

Figure 6:
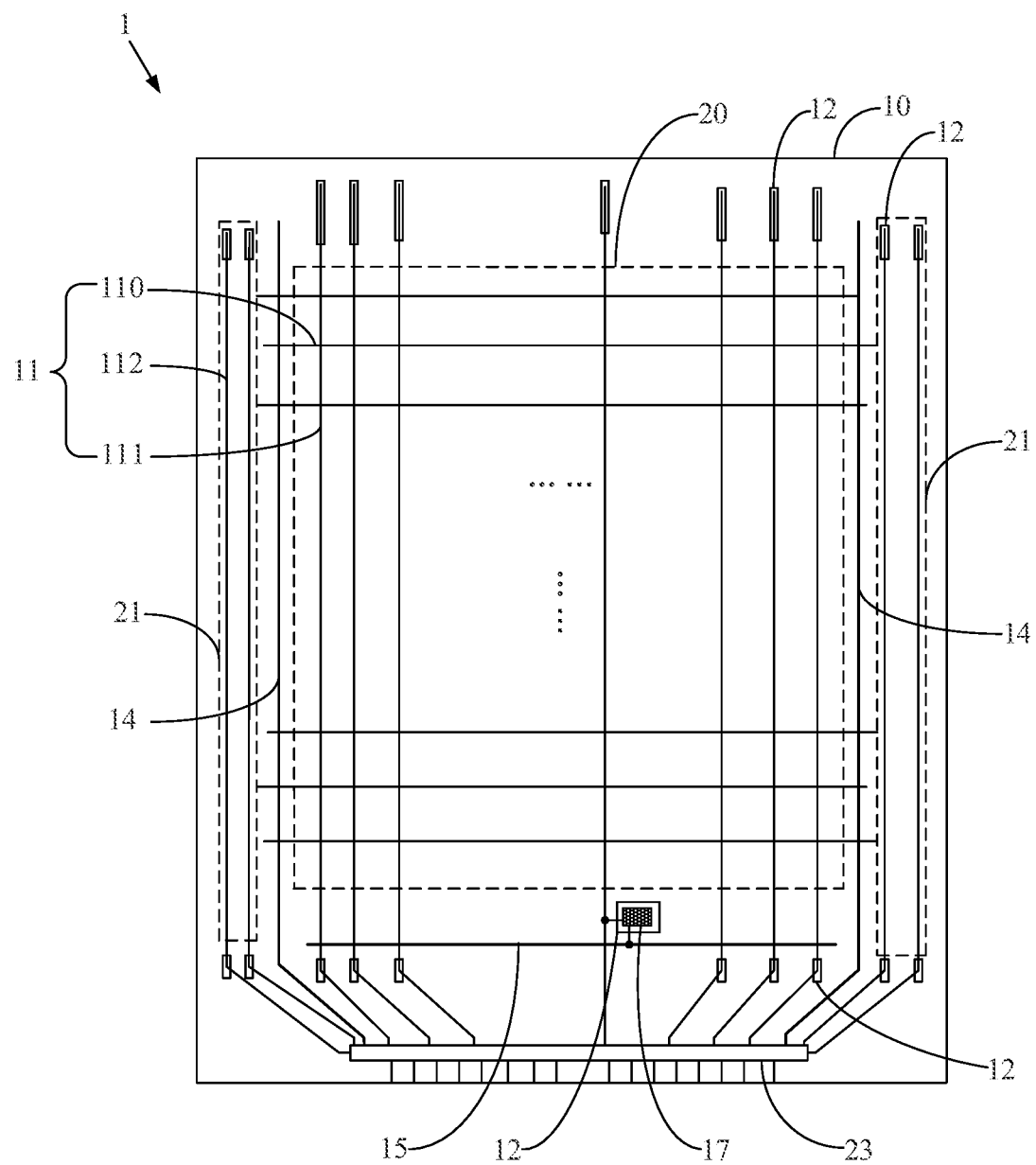
FIG. 6 is a third structural diagram of a display substrate according to an embodiment of the present disclosure.

As shown in FIG. 6, an embodiment of the present disclosure further provides a display substrate 1 which includes: signal lines 11, a first electrostatic protection line 15, and a first electrostatic protection unit 17 connected respectively to the signal lines 11 and the first electrostatic protection line 15; the display substrate further includes a discharge-limiting component 12, and an orthographic projection of the discharge-limiting component 12 on the base substrate 10 of the display substrate 1 and an orthographic projection of the first electrostatic protection unit 17 on the base substrate 10 at least partially overlap.

When the above display substrate 1 is in operation, electric signal is transmitted on the signal line 11, so that it is easy to accumulate electrostatic charges on the signal line 11. Since the signal line 11 is connected to the first electrostatic protection line 15 through the first electrostatic protection unit 17, the electrostatic charges accumulated on the signal line 11 will be discharged to the first electrostatic protection line 15 through the first electrostatic protection unit 17, thereby preventing static electricity from affecting the signal line 11. With the arrangement in which the orthographic projection of the discharge-limiting component 12 on the base substrate 10 of the display substrate 1 and the orthographic projection of the first electrostatic protection unit 17 on the base substrate 10 at least partially overlap, a portion of the first electrostatic protection unit 17 located within the overlapping region be insulated from the surrounding film layer having conductivity by the discharge-limiting component 12, thereby limiting the first electrostatic protection unit 17 to discharge static electricity to only the first electrostatic protection line 15 instead of other film layers.

According to the specific structure and the practical application of the above display substrate 1, in the display substrate 1 provided in the embodiment of the present disclosure, the signal line 11 is connected to the first electrostatic protection line 15 through the first electrostatic protection unit 17 so that the electrostatic charges accumulated on the signal line 11 can be discharged to the first electrostatic protection line 15 through the first electrostatic protection unit 17; meanwhile, the display substrate 1 is provided with the discharge-limiting component 12 therein and the orthographic projection of the discharge-limiting component 12 on the base substrate 10 of the display substrate 1 at least partially overlaps with the orthographic projection of the first electrostatic protection unit 17 on the base substrate 10. By the discharge-limiting component 12, the first electrostatic protection unit 17 is limited to discharge the electrostatic charges generated on the signal line to only the first electrostatic protection line 15 instead of other film layers, thereby avoiding damage to the first electrostatic protection unit 17 itself and other film layers surround it caused by abnormal discharge of the first electrostatic protection unit 17. Therefore, in the display substrate 1 provided by the embodiment of the present disclosure, the signal line 11 can be normally discharged through the first electrostatic protection unit 17, so that both the signal line 11 and the first electrostatic protection unit 17 are not easily affected by static electricity, thereby ensuring the yield of the display substrate 1.

Figure 8:
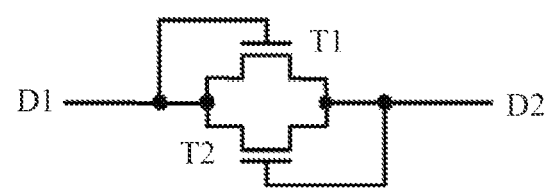
FIG. 8 is a structural diagram of a electrostatic protection unit according to an embodiment of the present disclosure.

It should be noted that, for the first electrostatic protection unit 17 in the embodiment of the present disclosure, an electrostatic protection unit as shown in FIG. 8 may be adopted. This electrostatic protection unit includes a first transistor T1 and a second transistor T2, and has two connection terminals: a first connection terminal D1 and a second connection terminal D2; wherein the source and the gate of the first transistor T1 and the drain of the second transistor T2 are connected to the first connection terminal D1; the source and the gate of the second transistor T2 and the drain of the first transistor T1 are connected to the second connection terminal D2. When the electrostatic protection unit is applied as the first electrostatic protection unit 17, the first connection end D1 and the second connection end D2 are connected to the signal line 11 and the first electrostatic protection line 15, respectively.

In some embodiments, the orthographic projection of the discharge-limiting component 12 on the base substrate 10 of the display substrate 1 covers the orthographic projection of the first electrostatic protection unit 17 on the base substrate 10.

Specifically, with the arrangement in which the orthographic projection of the discharge-limiting component 12 on the base substrate 10 of the display substrate covers the orthographic projection of the first electrostatic protection unit 17 on the base substrate 10, the discharge-limiting component 12 can better insulate the entire first electrostatic protection unit 17 from the surrounded film layer having conductivity, thereby better ensuring that the first electrostatic protection unit 17 can discharge the electrostatic charges generated on the signal line 11 only to the first electrostatic protection line 15 instead of other film layers, and thus avoiding damage to the first electrostatic protection unit 17 itself and other film layers surround it caused by abnormal discharge of the first electrostatic protection unit 17.

In some embodiments, the above first electrostatic protection line 15 may be manufactured in a same layer and with a same material as the data line metal layer in the display substrate 1, so that the first electrostatic protection line 15 and the data lines 111, the source/drain metal electrodes in the display substrate can be manufactured simultaneously by a single patterning process, which avoids adding an additional process flow for manufacturing the first electrostatic protection line 15.

In some embodiments, the first electrostatic protection line 15 may include a common electrode line 14.

Specifically, by using the above first electrostatic protection line 15 as the common electrode line 14, the electrostatic charges accumulated on the signal line 11 can be discharged to the common electrode line 14 through the first electrostatic protection unit 17, thereby preventing the static electricity from affecting the signal line 11 adversely. Moreover, since there are multiply common electrode lines 14 included in the display substrate 1, by using the above first electrostatic protection line 15 as the common electrode line 14, a common electrode line 14 existing in the display substrate 1 may also function as the first electrostatic protection line 15, such that another first electrostatic protection line 15 dedicated to discharge the signal line 11 can be avoided.

It should be noted that the common electrodes 14 in the display substrate 1 may be manufactured in a same layer and with a same material as the gate metal layer in the display substrate, so that the common electrode lines 14 and the gate electrodes and gate lines 110 in the display substrate 1 can be manufactured simultaneously by a single patterning process, which avoids adding an additional process flow for manufacturing the common electrode lines 14.

Further, the above discharge-limiting component 12 and the photo spacers in the display substrate 1 are manufactured in a same layer and with a same material.

Specifically, a liquid crystal display device mainly includes an array substrate and a color filter substrate arranged opposite to each other, filled with liquid crystal molecules therebetween. Further, photo spacers are provided between the array substrate and the color filter substrate. The photo spacers may be disposed on either the array substrate or the color filter substrate to control the cell thickness of the liquid crystal cell formed by aligning the array substrate and the color film substrate. When the display substrate 1 is applied to a liquid crystal display device, the display substrate 1 may be used as an array substrate, and the photo spacers may be disposed on the display substrate 1. Since the material of the photo spacers is generally an insulation material, manufacturing the discharge-limiting component 12 in the same layer and with the same material as the photo spacers not only makes the resulted discharge-limiting component 12 have good insulativity in order to better limit the discharge, but also realizes the simultaneous manufacture of the photo spacers and the discharge-limiting component 12 by a single patterning process, which avoids adding a manufacturing process dedicated to the discharge-limiting component 12, thereby effectively simplifying the manufacturing process flow of the display substrate 1 and saving manufacturing costs.

Furthermore, the above discharge-limiting component 12 may include a resin member.

Specifically, because the resin material itself has good light transmittance and insulativity, the discharge-limiting component 12 that is manufactured as a resin member using the resin material ensures that the discharge-limiting component 12 has both good insulativity and good light transmittance. In this way, when the discharge-limiting component 12 is disposed in the display substrate 1, the size of the discharge-limiting component 12 can be made as large as possible to enhance its discharge-limiting effect. It can be seen that the discharge-limiting component 12 that is a resin member can make the discharge-limiting component 12 have a better discharge-limiting effect without affecting the transmittance of the display substrate 1.

The size of the above discharge-limiting component 12 may be set according to actual needs. Exemplarily, the thickness of the discharge-limiting component 12 in a direction perpendicular to the base substrate 10 may be set to about 1 μm to 3 μm (for example, the error is 5% or less). The discharge-limiting component 12 set in such a size can realize a good discharge-limiting effect without having a significant influence on the overall thickness of the display substrate 1, which is advantageous for reducing the thickness of the display substrate 1.

It should be noted that, in the display substrate 1 provided in the above embodiment, there are various types of signal lines. For example, the signal lines 11 includes gate lines 110, data lines 111, and/or GOA traces 112 located in the gate driver circuit region 21 in the periphery of the display region 20, and so on. For a detailed description of the GOA traces, please refer to the foregoing embodiment, and details are not described herein again. These different types of signal lines 11 may be made of metal materials such as Cu, Al, Mo, Ti, Cr, W, and can also be made of alloys of these materials.

Figure 7:
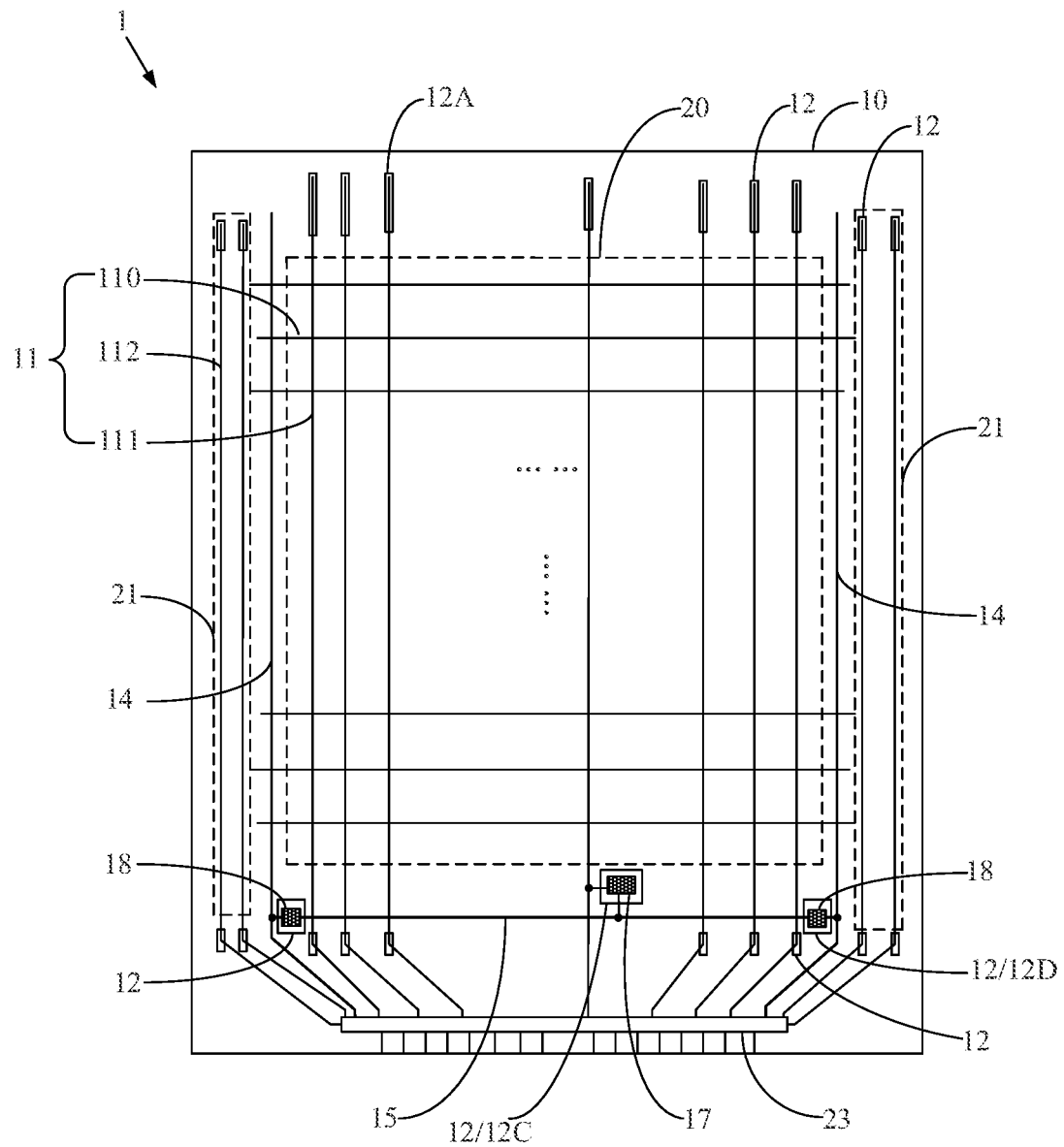
FIG. 7 is a fourth structural diagram of a display substrate according to an embodiment of the present disclosure.

As shown in FIG. 7, an embodiment of the present disclosure further provides a display substrate which includes: a signal line 11, a first electrostatic protection line 15, a common electrode line 14, a first electrostatic protection unit 17 connected to the signal line 11 and the first electrostatic protection line 15 respectively, and a second electrostatic protection unit 18 connected to the first electrostatic protection line 15 and the common electrode line 14 respectively. The display substrate 1 further includes a discharge-limiting component 12, and an orthographic projection of the discharge-limiting component 12 on the base substrate 10 of the display substrate 1 and an orthographic projection of the second electrostatic protection unit 18 on the base substrate 10 at least partially overlap.

When the above display substrate 1 is in operation, electric signal is transmitted on the signal line 11, so that it is easy to accumulate electrostatic charges on the signal line 11. Since the signal line 11 is connected to the first electrostatic protection line 15 through the first electrostatic protection unit 17, and the first electrostatic protection 15 is connected to the common electrode line 14 through the second electrostatic protection unit 18, the electrostatic charges accumulated on the signal line 11 will be discharged to the first electrostatic protection line 15 through the first electrostatic protection unit 17, and then discharged to the common electrode line 14 through the second electrostatic protection unit 18, thereby preventing static electricity from affecting the signal line 11. With the arrangement in which the orthographic projection of the discharge-limiting component 12 on the base substrate 10 of the display substrate 1 and the orthographic projection of the second electrostatic protection unit 18 on the base substrate 10 at least partially overlap, a portion of the second electrostatic protection unit 18 located within the overlapping region be insulated from the surrounding film layer having conductivity by the discharge-limiting component 12, thereby the second electrostatic protection unit 18 is limited to discharge static electricity to only the common electrode line 14, rather than other film layers.

According to the specific structure and the practical application of the above display substrate 1, it can be known that, in the display substrate 1 provided in the embodiment of the present disclosure, the signal line 11 is connected to the first electrostatic protection line 15 through the first electrostatic protection unit 17 and the first electrostatic protection line 15 is connected to the common electrode line 14 through the second electrostatic protection unit 18, so that the electrostatic charges accumulated on the signal line 11 can be discharged to the first electrostatic protection line 15 through the first electrostatic protection unit 17, and then discharged to the common electrode line 14 through the second electrostatic protection unit 18. Meanwhile, the display substrate 1 is provided with the discharge-limiting component 12 therein, and the orthographic projection of the discharge-limiting component 12 on the base substrate 10 of the display substrate 1 at least partially overlaps with the orthographic projection of the second electrostatic protection unit 18 on the base substrate 10. By the discharge-limiting component 12, the second electrostatic protection unit 18 is limited to discharge the electrostatic charges generated on the signal line to only the common electrode line 14 instead of other film layers, thereby avoiding damage to the second electrostatic protection unit 18 itself and other film layers surround it caused by abnormal discharge of the second electrostatic protection unit 18. Therefore, in the display substrate 1 provided by the embodiment of the present disclosure, the signal line 11 can be normally discharged through the second electrostatic protection unit 18, so that both the signal line 11 and the second electrostatic protection unit 18 are not easily affected by static electricity, thereby ensuring the yield of the display substrate 1.

It should be noted that, in the display substrate 1 provided by the above embodiment, while the orthographic projection of the discharge-limiting component 12 on the base substrate 10 of the display substrate 1 is arranged to at least partially overlap with the orthographic projection of the second electrostatic protection unit 18 on the base substrate 10, another discharge-limiting component 12 may be also provided, and the orthographic projection of the another discharge-limiting component 12 on the base substrate 10 of the display substrate 1 may be arranged to at least partially overlap with the orthographic projection of the first electrostatic protection unit 17 on the base substrate 10. Thus, both the first and second electrostatic protection units 17 and 18 can discharge through the normal discharge channel under the action of the discharge-limiting component 12, thereby the yield of the display substrate 1 can be further ensured.

In addition, it should be noted that, for each of the first and second electrostatic protection units 17 and 18 in the embodiment of the present disclosure, an electrostatic protection unit as shown in FIG. 8 may be adopted. This electrostatic protection unit includes a first transistor T1 and a second transistor T2, and has two connection terminals: a first connection terminal D1 and a second connection terminal D2; wherein the source and the gate of the first transistor T1 and the drain of the second transistor T2 are connected to the first connection terminal D1; the source and the gate of the second transistor T2 and the drain of the first transistor T1 are connected to the second connection terminal D2. When the electrostatic protection unit is applied as the first electrostatic protection unit 17, the first connection end D1 and the second connection end D2 are connected to the signal line 11 and the first electrostatic protection line 15, respectively. When the electrostatic protection unit is applied as the second electrostatic protection unit 18, the first connection end D1 and the second connection end D2 are connected to the first electrostatic protection line 15 and the common electrode line 14.

In some embodiments, the orthographic projection of the discharge-limiting component 12 on the base substrate 10 of the display substrate 1 covers the orthographic projection of the second electrostatic protection unit 18 on the base substrate 10.

Specifically, with the arrangement in which the orthographic projection of the discharge-limiting component 12 on the base substrate 10 of the display substrate covers the orthographic projection of the second electrostatic protection unit 18 on the base substrate 10, the discharge-limiting component 12 can better insulate the entire second electrostatic protection unit 18 from the surrounded film layer having conductivity, thereby limiting the first electrostatic protection unit 17 to discharge the electrostatic charges only to the common electrode line 14 instead of other film layers, thereby better ensuring the yield of the display substrate 1.

Further, the above discharge-limiting component 12 may be manufactured in a same layer and with a same material as the photo spacers in the display substrate 1.

Specifically, a liquid crystal display device mainly includes an array substrate and a color filter substrate arranged opposite to each other, with liquid crystal molecules filled therebetween. Further, photo spacers are provided between the array substrate and the color filter substrate. The photo spacers may be disposed on either the array substrate or the color filter substrate to control the cell thickness of the liquid crystal cell formed by aligning the array substrate and the color film substrate. When the display substrate 1 is applied to a liquid crystal display device, the display substrate 1 may be used as an array substrate, and the photo spacers may be disposed on the display substrate 1. Since the material of the photo spacers is generally an insulation material, manufacturing the discharge-limiting component 12 in the same layer and with the same material as the photo spacers not only makes the resulted discharge-limiting component 12 have good insulativity in order to better limit the discharge, but also realizes the simultaneous manufacture of the photo spacers and the discharge-limiting component 12 by a single patterning process, which avoids adding a manufacturing process dedicated to the discharge-limiting component 12, thereby effectively simplifying the manufacturing process flow of the display substrate 1 and saving manufacturing costs.

Furthermore, the above discharge-limiting component 12 may include a resin member.

Specifically, because the resin material itself has good light transmittance and insulativity, the discharge-limiting component 12 that is manufactured as a resin member using the resin material ensures that the discharge-limiting component 12 has both good insulativity and good light transmittance. In this way, when the discharge-limiting component 12 is disposed in the display substrate 1, the size of the discharge-limiting component 12 can be made as large as possible to enhance its discharge-limiting effect. It can be seen that the discharge-limiting component 12 that is a resin member can make the discharge-limiting component 12 have a better discharge-limiting effect without affecting the transmittance of the display substrate 1.

The size of the above discharge-limiting component 12 may be set according to actual needs. Exemplarily, the thickness of the discharge-limiting component 12 in a direction perpendicular to the base substrate 10 may be set to about 1 µm to 3 µm (for example, the error is 5% or less). The discharge-limiting component 12 set in such a size can realize a good discharge-limiting effect without having a significant influence on the overall thickness of the display substrate 1, which is advantageous for reducing the thickness of the display substrate 1.

It should be noted that, in the display substrate 1 provided in the above embodiment, there are various types of signal lines. For example, the signal lines 11 includes gate lines 110, data lines 111, and/or GOA traces 112 located in the gate driver circuit region 21 in the periphery of the display region 20, and so on. For a detailed description of the GOA traces, please refer to the foregoing embodiments, and details are not described herein again.

Figure 9:
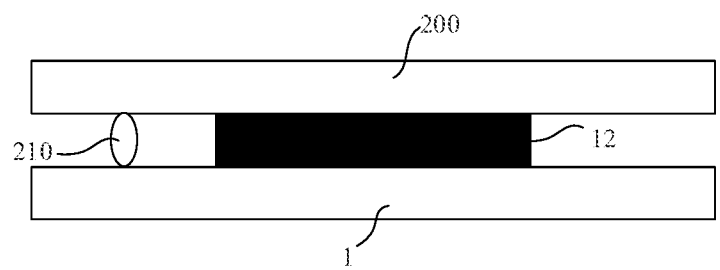
FIG. 9 is a structural diagram of a display device according to an embodiment of the present disclosure.

An embodiment of the present disclosure further provides a display device which, as shown in FIG. 9, includes the display substrate 1 (such as an array substrate) provided by any of above embodiments, an opposite substrate (a color filter substrate) 200, and a photo spacer 210 provided on the array substrate. The discharge-limiting component 12 in the display substrate 1 is manufactured in a same layer and with a same material as the photo spacer 210.

In the above display substrates 1 provided by the above embodiments, the discharge-limiting component 12 is provided, and the orthographic projection of the discharge-limiting component 12 (also referred to as the first discharge-limiting component 12A, as shown in FIG. 7) on the base substrate 10 of the display substrate 1 at least partially overlaps with the orthographic projection of the signal line 11; and/or, the orthographic projection of the discharge-limiting component 12 (also referred to as the second discharge-limiting component 12B, as shown in FIG. 4) on the base substrate 10 at least partially overlaps with the orthographic projection of the connection via 13 on the base substrate 10; and/or, the orthographic projection of the discharge-limiting component 12 (also referred to as the third discharge-limiting component 12C, as shown in FIG. 7) on the base substrate 10 at least partially overlaps with the orthographic projection of the first electrostatic protection unit 17 on the base substrate 10; and/or, the orthographic projection of the discharge-limiting component 12 (also referred to as the fourth discharge-limiting component 12D, as shown in FIG. 7) on the base substrate 10 at least partially overlaps with the orthographic projection of the second electrostatic protection unit 18 on the base substrate 10; thus, no abnormal discharge will occur at the signal line 11, the connection via 13, the first electrostatic protection unit 17, and the second electrostatic protection unit 18 in the display substrate 1, which ensures a high yield of the display substrate 1. Accordingly, the display device provided by an embodiment of the present disclosure which includes the display substrate 1 according to any of the above embodiments also has the above advantages, and details are not described here again.

Unless otherwise defined, the technical or scientific terms used in the present disclosure shall have the ordinary meanings understood by those having ordinary skills in the field to which the present disclosure belongs. The terms "first",
"second", and the like used in this disclosure do not indicate any order, quantity, or importance, but are only used to distinguish different components. Words such as "comprise" or "includes" mean that the element or item appearing before the word covers the element or item appearing after the word and the equivalent thereof without excluding other elements or items. Words such as "connect" or "connected to" are not limited to physical or mechanical connections, but may include electrical connections, whether direct or indirect. "Up", "down", "left", "right", etc. are only used to indicate the relative position relationship. When the absolute position of the described object changes, the relative position relationship may also change accordingly.

It will be understood that when an element such as a layer, film, region, or substrate is referred to as being "on" or "under" another element, it can be "directly on" or "under" another element, or there may be intermediate element(s).

In the description of the foregoing embodiments, specific features, structures, materials, or characteristics may be combined in a suitable manner in any one or more embodiments or examples.

The above is only specific implementations of the present disclosure, but the scope of protection of the present disclosure is not limited thereto. Variations or replacements that can be easily conceived by any person skilled in the art within the technical scope disclosed in the present disclosure should be covered by the protective scope of this disclosure. Therefore, the protective scope of the present disclosure shall be defined by the protective scope of the claims.

The invention claimed is:

1. A display substrate, comprising:
a base substrate;
a signal line provided on the base substrate;
a first discharge-limiting component provided on the base substrate; wherein an orthographic projection of the first discharge-limiting component on the base substrate of the display substrate and an orthographic projection of the signal line on the base substrate at least partially overlap;
wherein the orthographic projection of the first discharge-limiting component on the base substrate and an orthographic projection of an end portion of the signal line on the base substrate at least partially overlap; and
wherein the display substrate further comprises a passivation layer covering the signal line; the first discharge-limiting component is directly formed on a surface of the passivation layer away from the signal line, and the orthographic projection of the first discharge-limiting component on the base substrate covers the orthographic projection of the end portion of the signal line on the base substrate.

2. The display substrate according to claim 1, wherein the first discharge-limiting component has an elongated shape along an extending direction of the signal line, and has a portion extending beyond the end portion of the signal line.

3. The display substrate according to claim 2, wherein, along the extending direction of the signal line, a length of the portion of the first discharge-limiting component extending beyond the end portion of the signal line is greater than or equal to about 0.5 µm and less than or equal to 10 µm.

4. A display substrate, comprising:
a base substrate;
a signal line provided on the base substrate;
a first electrostatic protection line provided on the base substrate;

a first electrostatic protection unit connected to the signal line and the first electrostatic protection line respectively; and a discharge-limiting component;

wherein an orthographic projection of the discharge-limiting component on the base substrate and an orthographic projection of the first electrostatic protection unit on the base substrate at least partially overlap;

wherein the orthographic projection of the first discharge-limiting component on the base substrate and an orthographic projection of an end portion of the signal line on the base substrate at least partially overlap; and wherein the display substrate further comprises a passivation layer covering the signal line; the first discharge-limiting component is directly formed on a surface of the passivation layer away from the signal line, and the orthographic projection of the first discharge-limiting component on the base substrate covers the orthographic projection of the end portion of the signal line on the base substrate.

5. The display substrate according to claim 4, wherein the orthographic projection of the discharge-limiting component on the base substrate covers the orthographic projection of the first electrostatic protection unit on the base substrate.

6. The display substrate according to claim 5, wherein the first electrostatic protection line is connected to a common electrode line.

7. The display substrate according to claim 6, wherein the display substrate further comprises:
   a second electrostatic protection unit connected to the first electrostatic protection line and the common electrode line respectively; and another discharge-limiting component;
   wherein, an orthographic projection of the another discharge-limiting component on the base substrate and an orthographic projection of the second electrostatic protection unit on the base substrate at least partially overlap.

8. A display substrate, comprising:
   a base substrate;
   a signal line provided on the base substrate;
   a first electrostatic protection line provided on the base substrate;
   a common electrode line provided on the base substrate;
   a first electrostatic protection unit connected to the signal line and the first electrostatic protection line respectively;
   a second electrostatic protection unit connected to the first electrostatic protection line and the common electrode line respectively; and
   a discharge-limiting component provided on the base substrate;
   wherein an orthographic projection of the discharge-limiting component on the base substrate and an orthographic projection of the second electrostatic protection unit on the base substrate at least partially overlap;
   wherein the orthographic projection of the first discharge-limiting component on the base substrate and an orthographic projection of an end portion of the signal line on the base substrate at least partially overlap; and
   wherein the display substrate further comprises a passivation layer covering the signal line; the first discharge-limiting component is directly formed on a surface of the passivation layer away from the signal line, and the orthographic projection of the first discharge-limiting component on the base substrate covers the orthographic projection of the end portion of the signal line on the base substrate.

9. A display substrate, comprising:
   a base substrate;
   a signal line provided on the base substrate;
   a first discharge-limiting component provided on the base substrate; wherein an orthographic projection of the first discharge-limiting component on the base substrate of the display substrate and an orthographic projection of the signal line on the base substrate at least partially overlap;
   wherein the signal line has a polyline shape and comprises at least one bending portion, the orthographic projection of the first discharge-limiting component on the base substrate and an orthographic projection of the bending portion of the signal line on the base substrate at least partially overlap.

10. A display substrate, comprising:
    a base substrate;
    a signal line provided on the base substrate;
    a first discharge-limiting component provided on the base substrate; wherein an orthographic projection of the first discharge-limiting component on the base substrate of the display substrate and an orthographic projection of the signal line on the base substrate at least partially overlap;
    wherein the display substrate further comprises a second discharge-limiting component provided on the base substrate, a lead for signal line provided on the base substrate, and a connection via for connecting the signal line to the lead for signal line; an orthographic projection of the second discharge-limiting component on the base substrate and an orthographic projection of the connection via on the base substrate at least partially overlap;
    wherein the orthographic projection of the second discharge-limiting component on the base substrate covers the orthographic projection of the connection via on the base substrate;
    wherein the display substrate further comprises a passivation layer covering the signal line and the connection via; the second discharge-limiting component is directly formed on a surface of the passivation layer away from the signal line.

11. The display substrate according to claim 10, wherein the display substrate further comprises:
    a first electrostatic protection line provided on the base substrate;
    a first electrostatic protection unit connected to the signal line and the first electrostatic protection line respectively; and
    a third discharge-limiting component provided on the base substrate;
    wherein, an orthographic projection of the third discharge-limiting component on the base substrate and an orthographic projection of the first electrostatic protection unit on the base substrate at least partially overlap.

12. The display substrate according to claim 11, wherein the first electrostatic protection line is connected to a common electrode line.

13. The display substrate according to claim 12, wherein the display substrate further comprises:
    a fourth discharge-limiting component provided on the base substrate; and a second electrostatic protection unit connected to the first electrostatic protection line and the common electrode line respectively;

wherein, an orthographic projection of the fourth discharge-limiting component on the base substrate and an orthographic projection of the second electrostatic protection unit on the base substrate at least partially overlap.

14. The display substrate according to claim 13, wherein the first, second, third, and fourth discharge-limiting components each comprise a resin member.

15. The display substrate according to claim 13, wherein the first, second, third, and fourth discharge-limiting components each have a thickness of about 1 μm to about 3 μm in a direction perpendicular to the base substrate.

16. The display substrate according to claim 13, wherein the signal line comprises a gate line and/or a data line.

\* \* \* \* \*